US012633723B2

(12) United States Patent
Lai et al.

(10) Patent No.: US 12,633,723 B2
(45) Date of Patent: May 19, 2026

(54) SURFACE EMITTING LASER APPARATUS AND METHOD FOR MANUFACTURING THE SAME

(71) Applicant: HLJ TECHNOLOGY CO., LTD., Hsinchu County (TW)

(72) Inventors: Li-Hung Lai, Hsinchu County (TW); Li-Wen Lai, Hsinchu County (TW)

(73) Assignee: HLJ TECHNOLOGY CO., LTD., Hsinchu County (TW)

( * ) Notice: Subject to any disclaimer, the term of this patent is extended or adjusted under 35 U.S.C. 154(b) by 637 days.

(21) Appl. No.: 18/154,857

(22) Filed: Jan. 16, 2023

(65) Prior Publication Data

US 2024/0136791 A1    Apr. 25, 2024
US 2024/0235158 A9    Jul. 11, 2024

(30) Foreign Application Priority Data

Oct. 19, 2022    (TW) .................................. 111139579

(51) Int. Cl.
H01S 5/183        (2006.01)
H01S 5/042        (2006.01)

(52) U.S. Cl.
CPC ...... H01S 5/18308 (2013.01); H01S 5/04256 (2019.08); H01S 5/18377 (2013.01)

(58) Field of Classification Search
CPC ......................... H01S 5/18308; H01S 5/04256
See application file for complete search history.

(56) References Cited

U.S. PATENT DOCUMENTS

| | | | |
|---|---|---|---|
| 2003/0162315 A1* | 8/2003 | Kapon | H01S 5/18308 438/22 |
| 2003/0185267 A1 | 10/2003 | Hwang et al. | |
| 2006/0193361 A1* | 8/2006 | Casimirus | B82Y 20/00 372/45.01 |
| 2011/0280269 A1* | 11/2011 | Chang-Hasnain | H01S 5/18366 372/50.1 |
| 2014/0247853 A1 | 9/2014 | Deppe | |
| 2018/0019572 A1 | 1/2018 | Deppe | |
| 2018/0241177 A1* | 8/2018 | Wong | H01S 5/3095 |

FOREIGN PATENT DOCUMENTS

JP            2021036553 A        3/2021

* cited by examiner

*Primary Examiner* — Yuanda Zhang
(74) *Attorney, Agent, or Firm* — Li & Cai Intellectual Property Office

(57)        ABSTRACT

A surface emitting laser apparatus and a method for manufacturing the same are provided. The surface emitting laser apparatus includes a first reflector layer, an active light-emitting layer, a second reflector layer, and a current confinement structure. The active light-emitting layer is disposed between the first reflector layer and the second reflector layer, so as to produce a laser beam. The current confinement structure has one P-N junction or one PIN junction.

7 Claims, 14 Drawing Sheets

SURFACE EMITTING LASER APPARATUS AND METHOD FOR MANUFACTURING THE SAME

CROSS-REFERENCE TO RELATED PATENT APPLICATION

This application claims the benefit of priority to Taiwan Patent Application No. 111139579, filed on Oct. 19, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a surface emitting laser apparatus and a method for manufacturing the same, and more particularly to a vertical cavity surface emitting laser apparatus and a method for manufacturing the same.

BACKGROUND OF THE DISCLOSURE

A conventional vertical cavity surface emitting laser at least includes a P-type electrode, an N-type electrode, an active layer for production of photons, and an upper distributed Bragg reflector (DBR) as well as a lower DBR that are respectively disposed on two sides of the active layer. Through applying a bias voltage to the P-type electrode and the N-type electrode, a current is injected into the active layer to excite the photons. Further, the upper DBR and the lower DBR are used to form a vertical resonant cavity, such that a laser beam emitted from a surface of a component (i.e., in a direction perpendicular to the active layer) can be produced.

In the conventional vertical cavity surface emitting laser, an oxide layer or an ion implantation region with high resistance is usually formed on the upper DBR by an ion implantation process or a wet oxidation process, so as to confine a region through which the current flows. However, when the oxide layer or the ion implantation region for confining the current is formed by the ion implantation process or a thermal oxidation process, the costs are high and a hole size cannot be easily controlled.

In addition, there are great differences between the oxide layer and a semiconductor material of the upper DBR in terms of a lattice mismatch and a thermal coefficient of expansion, thereby causing the vertical cavity surface emitting laser to be easily broken due to an internal stress after an annealing process and a manufacturing yield to be reduced. The internal stress of the component also reduces the lifespan of the component, affects lighting characteristics, and decreases the reliability. Moreover, the conventional vertical cavity surface emitting laser is susceptible to impacts of an electrostatic discharge (ESD) or a surge, which can result in internal damages.

SUMMARY OF THE DISCLOSURE

In response to the above-referenced technical inadequacies, the present disclosure provides a surface emitting laser apparatus and a method for manufacturing the same, so as to decrease an internal stress of the surface emitting laser apparatus and improve an anti-electrostatic capability of the surface emitting laser apparatus.

In one aspect, the present disclosure provides a surface emitting laser apparatus, which includes a first reflector layer, an active light-emitting layer, a second reflector layer, and a current confinement structure. The active light-emitting layer is disposed between the first reflector layer and the second reflector layer so as to produce a laser beam. The current confinement structure has one P-N junction or one PIN junction.

In another aspect, the present disclosure provides a surface emitting laser apparatus, which includes a first reflector layer, an active light-emitting layer, a second reflector layer, and a current confinement structure. The active light-emitting layer is disposed between the first reflector layer and the second reflector layer so as to produce a laser beam. The current confinement structure includes a Zener diode.

In yet another aspect, the present disclosure provides a method of manufacturing a surface emitting laser apparatus, which includes: forming a first reflector layer; forming an active light-emitting layer on the first reflector layer; forming a current confinement structure; and forming a second reflector layer. The current confinement structure defines a confinement hole, and has a P-N junction or a PIN junction.

One of the beneficial effects of the present disclosure is that, in the surface emitting laser apparatus and the method for manufacturing the same provided by the present disclosure, by virtue of "a current confinement structure having one P-N junction or one PIN junction" or "a current confinement structure including a Zener diode," the surface emitting laser apparatus can have an improved reliability and an enhanced anti-electrostatic capability.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
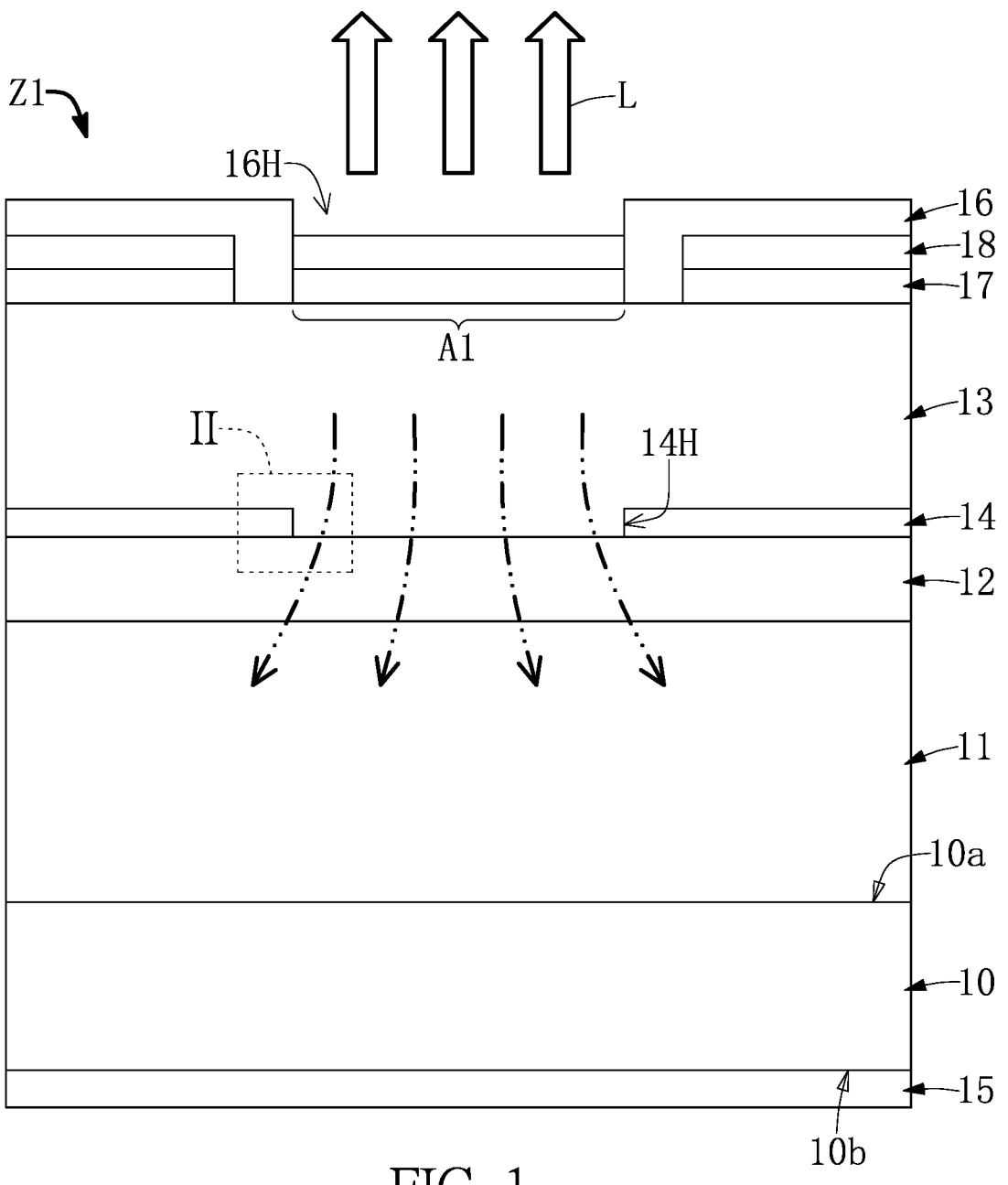
FIG. 1 is a schematic cross-sectional view of a surface emitting laser apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figures 2, 3:
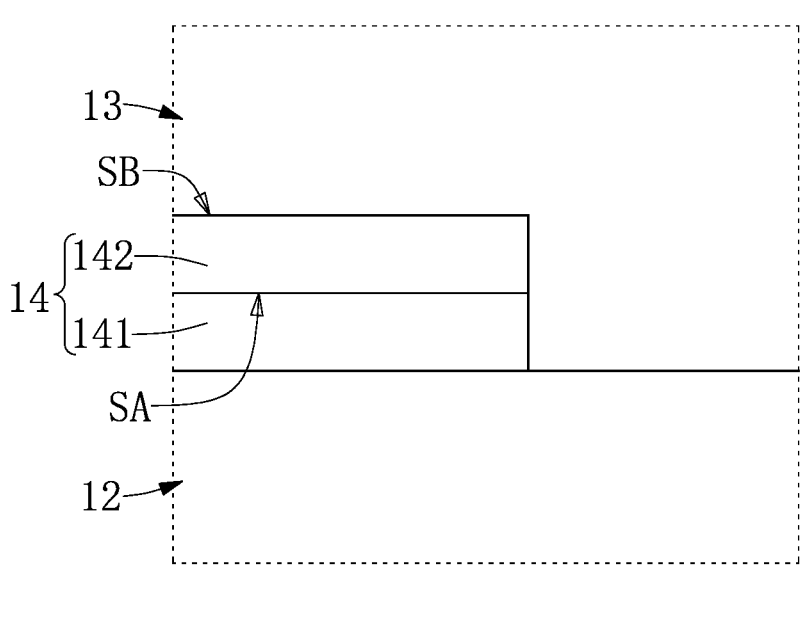
FIG. 2 is a schematic enlarged view of part II of FIG. 1.
FIG. 3 is a partial schematic enlarged view of a surface emitting laser apparatus according to another embodiment of the present disclosure.

Referring to FIG. 1 and FIG. 2, a first embodiment of the present disclosure provides a surface emitting laser apparatus Z1. In the embodiments of the present disclosure, the surface emitting laser apparatus Z1 is a vertical cavity surface emitting laser apparatus. The surface emitting laser apparatus Z1 includes a first reflector layer 11, an active light-emitting layer 12, a second reflector layer 13, and a current confinement structure 14. Specifically, in the present embodiment, the surface emitting laser apparatus Z1 further includes a substrate 10. The first reflector layer 11, the active light-emitting layer 12, the second reflector layer 13, and the current confinement structure 14 are disposed on the substrate 10, and the active light-emitting layer 12 is arranged between the first reflector layer 11 and the second reflector layer 13.

The substrate 10 can be an insulation substrate or a semiconductor substrate. The insulation substrate can be, for example, a sapphire, and the semiconductor substrate can be, for example, silicon, germanium, silicon carbide, or a group III-V semiconductor. The group III-V semiconductor can be, for example, gallium arsenide (GaAs), arsenic phosphide (InP), aluminum nitride (AlN), indium nitride (InN), or gallium nitride (GaN). In addition, the substrate 10 has an epitaxial surface 10*a* and a bottom surface 10*b* that is opposite to the epitaxial surface 10*a*.

The first reflector layer 11, the active light-emitting layer 12, and the second reflector layer 13 are sequentially disposed on the epitaxial surface 10*a* of the substrate 10. In the present embodiment, each of the first reflector layer 11, the active light-emitting layer 12, and the second reflector layer 13 has a cross-sectional width the same as that of the active light-emitting layer 12.

Each of the first reflector layer 11 and the second reflector layer 13 can be a distributed Bragg reflector (DBR) that is formed by alternately stacking two films having different refractive indices, so as to allow light to be resonantly reflected at a predetermined wavelength. In the present embodiment, materials of the first reflector layer 11 and the second reflector layer 13 can be doped group III-V semiconductors, and the first reflector layer 11 and the second reflector layer 13 have different conductivity types.

The active light-emitting layer 12 is formed on the first reflector layer 11 to produce a laser beam L. Specifically, the active light-emitting layer 12 is arranged between the first reflector layer 11 and the second reflector layer 13, and can be excited by electric power to produce an initial beam. The initial beam produced by the active light-emitting layer 12 is resonantly reflected between the first reflector layer 11 and the second reflector layer 13 to be amplified. Eventually, the initial beam is emitted by the second reflector layer 13 to produce the laser beam L.

The active light-emitting layer 12 includes a plurality of layers (such as a plurality of trap layers and a plurality of barrier layers that are alternately stacked on each other and un-doped) for formation of a multiple quantum well. Materials of the trap layer and the barrier layer are determined according to a wavelength of the laser beam L to be produced. For example, when the laser beam L to be produced is red light, the trap layer and the barrier layer can be a gallium arsenide layer and an aluminum gallium arsenide ($AlxGa_{(1-x)}As$) layer, respectively. When the laser beam L to be produced is blue light, the trap layer and the barrier layer can be a GaN layer and an InGaN layer, respectively. However, the present disclosure is not limited thereto.

Referring to FIG. 1 and FIG. 2, the current confinement structure 14 included in the surface emitting laser apparatus Z1 is arranged above or below the active light-emitting layer 12. The current confinement structure 14 has a confinement hole 14H, so as to define a current flow pathway. It should be noted that, as long as the current confinement structure 14 can be used to define a region through which a current flows, a position of the current confinement structure 14 is not limited in the present disclosure. In the present embodiment, the current confinement structure 14 is arranged in the second reflector layer 13 and connected to the active light-emitting layer 12. Specifically, in the present embodiment (as shown in FIG. 2), one part of the second reflection layer 13 is filled into the confinement hole 14H and connected to the active light-emitting layer 12. Since the second reflector layer 13 is a doped semiconductor material and has a high electrical conductivity, the current is allowed to flow through the one part of the second reflector layer 13 that is filled into the confinement hole 14H.

As shown in FIG. 2, in the present embodiment, the current confinement structure 14 may have at least one P-N junction SA. Specifically, the current confinement structure 14 includes a first conductive doped layer 141 and a second conductive doped layer 142, and the P-N junction SA is formed between the first conductive doped layer 141 and the second conductive doped layer 142. The first conductive doped layer 141 and the first reflector layer 11 have different conductivity types, and the second conductive doped layer 142 and the second reflector layer 13 also have different conductivity types. For example, when the conductivity type of the first reflector layer 11 is an N-type, the conductivity type of each of the second reflector layer 13 and the first conductive doped layer 141 is a P-type, and the conductivity type of the second conductive doped layer 142 is the N-type. When the conductivity type of the first reflector layer 11 is the P-type, the conductivity type of each of the second reflector layer 13 and the first conductive doped layer 141 is the N-type, and the conductivity type of the second conductive doped layer 142 is the P-type.

As shown in FIG. 2, the first conductive doped layer 141 of the current confinement structure 14 is configured to face the first reflector layer 11. Since the second reflector layer 13 and the second conductive doped layer 142 have different conductivity types, another P-N junction SB is formed between the second reflector layer 13 and the second conductive doped layer 142 in the surface emitting laser apparatus Z1. Accordingly, the current confinement structure 14 of the present embodiment includes a Zener diode that is jointly formed by the first conductive doped layer 141 and the second conductive doped layer 142.

It should be noted that a material of the current confinement structure 14 can be a semiconductor material that does not absorb the laser beam L. In other words, the material of the current confinement structure 14 can allow the laser beam L to pass through. Given that the wavelength of the laser beam L is λ (unit: nm), and an energy gap width of the semiconductor material of the current confinement structure 14 is Eg, the energy gap width Eg and the wavelength λ of the laser beam L can satisfy the following relationship: $Eg>(1240/\lambda)$. For example, when the wavelength λ of the laser beam L is 850 nm, the energy gap width Eg of the semiconductor material of the current confinement structure 14 is greater than 1.46 eV. In this way, a reduction of lighting efficiency of the surface emitting laser apparatus Z1 due to absorption of the laser beam L by the current confinement structure 14 can be avoided. In one embodiment, the energy gap width Eg of the semiconductor material of the current confinement structure 14 is greater than an energy gap width of a semiconductor material of the active light-emitting layer 12 (i.e., the trap layer).

Further, in the present embodiment, a lattice constant of the material of the current confinement structure 14 can match with a lattice constant of the material of the active light-emitting layer 12, so as to reduce interface defects. In one exemplary embodiment, a lattice mismatch between the material of the current confinement structure 14 and the material of the active light-emitting layer 12 is less than or equal to 0.1%. In addition, since the current confinement structure 14 of the present embodiment is disposed in the second reflector layer 13, a lattice mismatch between the material of the current confinement structure 14 and the material of the second reflector layer 13 is less than or equal to 0.1%.

Compared with a conventional oxide layer, the lattice mismatch between the current confinement structure 14 of the present embodiment and each of the active light-emitting layer 12 and the second reflector layer 13 are smaller. Accordingly, an internal stress of the surface emitting laser apparatus Z1 can be reduced, thereby improving a reliability of the surface emitting laser apparatus Z1. In the present embodiment, a total thickness of the current confinement structure 14 is 10 nm to 1000 nm. Since the materials of the current confinement structure 14, the active light-emitting layer 12, and the second reflector layer 13 are all semiconductor materials, their difference of thermal coefficient of expansion can be relatively decreased. In this way, the surface emitting laser apparatus Z1 can be prevented from cracking (caused by the difference of thermal coefficient of expansion) after an annealing process, thereby improving a manufacturing yield.

Referring to FIG. 1, the surface emitting laser apparatus Z1 of the embodiments of the present disclosure further includes a first electrode layer 15 and a second electrode layer 16. The first electrode layer 15 is electrically connected to the first reflector layer 11, and the second electrode layer 16 is electrically connected to the second reflector layer 13. In the embodiment shown in FIG. 1, the first electrode layer 15 and the second electrode layer 16 are disposed on different sides of the substrate 10, respectively. However, in another embodiment, the first electrode layer 15 and the second electrode layer 16 can both be disposed on the same side of the substrate 10.

Further, in the present embodiment, the first electrode layer 15 is disposed on the bottom surface 10b of the substrate 10. The second electrode layer 16 is disposed on the second reflector layer 13 and electrically connected to the second reflector layer 13. A current path through the active light-emitting layer 12 is defined between the first electrode layer 15 and the second electrode layer 16. Each of the first electrode layer 15 and the second electrode layer 16 can be a metal layer, an alloy layer, or a stacked layer made of different metal materials.

In the embodiment shown in FIG. 1, the second electrode layer 16 has an opening 16H for defining a light-emitting region A1, and the opening 16H corresponds to the confinement hole 14H of the current confinement structure 14, so as to allow the laser beam L produced by the active light-emitting layer 12 to emit from the opening 16H. In one embodiment, the second electrode layer 16 has a ring-shaped portion, but a top view pattern of the second electrode layer 16 is not limited in the present disclosure. A material of the second electrode layer 16 can be gold, tungsten, germanium, palladium, titanium, or any combination thereof.

In addition, the surface emitting laser apparatus Z1 further includes a current spreading layer 17 and a protection layer 18. The current spreading layer 17 is disposed on the second reflector layer 13 and electrically connected to the second electrode layer 16. In one embodiment, a material of the current spreading layer 17 is an electrically conductive material, so that the current injected into the active light-emitting layer 12 from the second reflector layer 13 is evenly distributed. In addition, the material of the current spreading layer 17 is a material that the laser beam L can pass through, so that the lighting efficiency of the surface emitting laser apparatus Z1 will not be overly sacrificed. For example, when the laser beam L has a wavelength of 850 nm, the material of the current spreading layer 17 can be the doped semiconductor material, such as heavily-doped gallium arsenide, but the present disclosure is not limited thereto.

The protection layer 18 covers the current spreading layer 17 and the light-emitting region A1, so as to prevent water from entering the surface emitting laser apparatus Z1 (which may affect lighting characteristics or the lifespan of the surface emitting laser apparatus Z1). In one embodiment, a material of the protection layer 18 can be a moisture-resistant material, such as silicon nitride, aluminum oxide, and a combination thereof, but the present disclosure is not limited thereto. In the present embodiment, the second electrode layer 16 is disposed on the protection layer 18, and passes through the protection layer 18 and the current spreading layer 17 to be connected to the second reflector layer 13, but the present disclosure is not limited thereto. In another embodiment, the current spreading layer 17 may also be omitted.

It is worth mentioning that at least a part of the Zener diode of the current confinement structure 14 is arranged on the current path defined by the first electrode layer 15 and the second electrode layer 16, so as to block the current. Accordingly, when a bias voltage is applied to the surface emitting laser apparatus Z1 through the first electrode layer 15 and the second electrode layer 16, the Zener diode of the current confinement structure 14 is applied with a reverse bias voltage, but is not broken down. Since the Zener diode is not conductive, the current is driven to bypass the current confinement structure 14 and pass only through the confinement hole 14H, thereby increasing a current density of the current injected into the active light-emitting layer 12.

However, when an electrostatic discharge is produced, the Zener diode of the current confinement structure 14 is conductive regardless of whether an electrostatic current is a positive current or a negative current. Since a resistance of the Zener diode that is conductive is much lower than a resistance of the reflector layer 13 arranged in the confinement hole 14H, most of the electrostatic current passes through the current confinement structure 14 instead of the confinement hole 14H. It should be noted that a top view area of the current confinement structure 14 is greater than a top view area of the confinement hole 14H. When the Zener diode of the current confinement structure 14 is conductive, the electrostatic current flowing through the active light-emitting layer 12 can be dispersed to reduce the current density, so that damage to the active light-emitting layer 12 can be avoided. Accordingly, the current confinement structure 14 can provide electrostatic discharge protection for the surface emitting laser apparatus Z1.

That is, in the surface emitting laser apparatus Z1 of the embodiments of the present disclosure, by having the Zener diode included in the current confinement structure 14, not only can the current flow pathway be defined, but the electrostatic discharge protection for the surface emitting laser apparatus Z1 can also be provided, thereby improving the reliability of the surface emitting laser apparatus Z1.

Referring to FIG. 3, FIG. 3 is a partial schematic enlarged view of a surface emitting laser apparatus according to another embodiment of the present disclosure. In the present embodiment, the current confinement structure 4 has a PIN junction, which can also achieve the same effect. Specifically, the current confinement structure 14 of the present embodiment can include the first conductive doped layer 141, the second conductive doped layer 142, and an intrinsic semiconductor layer 143.

The intrinsic semiconductor layer 143 is arranged between the first conductive doped layer 141 and the second conductive doped layer 142. The intrinsic semiconductive layer 143 is an undoped semiconductor layer, and a semiconductor material of the intrinsic semiconductor layer 143 can be the same as the semiconductor material of the first conductive doped layer 141 (or the second conductive doped layer 142), but the present disclosure is not limited thereto.

When the bias voltage is applied to the surface emitting laser apparatus Z1, the second conductive doped layer 142 and the first conductive doped layer 141 of the current confinement structure 14 are equivalent to being applied with the reverse bias voltage less than a collapse voltage, so that the current confinement structure 14 is in a non-conductive state. Therefore, the current is allowed to only pass through the confinement hole 14H of the current confinement structure 14.

When the reverse bias voltage applied to the current confinement structure 14 is greater than the collapse voltage due to production of the electrostatic discharge, the current confinement structure 14 can be in a conductive state, so that most of the electrostatic current flows through the current confinement structure 14. By having the intrinsic semiconductor layer 143 disposed between the first conductive doped layer 141 and the second conductive doped layer 142, the electrostatic discharge protection capability of the current confinement structure 14 for the surface emitting laser apparatus Z1 can be further improved.

Second Embodiment

Figure 4:
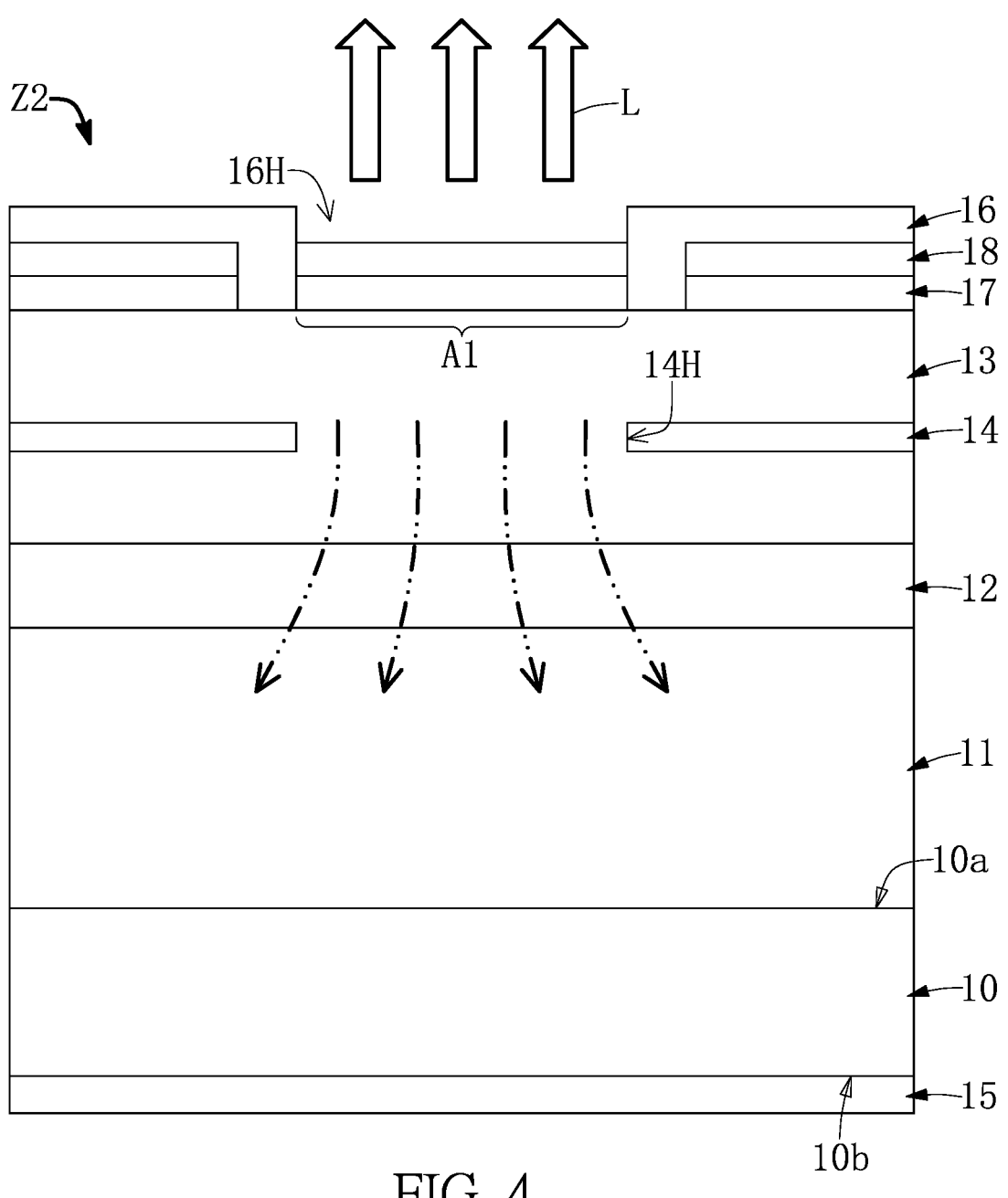
FIG. 4 is a schematic cross-sectional view of a surface emitting laser apparatus according to a second embodiment of the present disclosure.

Referring to FIG. 4, FIG. 4 is a schematic cross-sectional view of a surface emitting laser apparatus according to a second embodiment of the present disclosure. Components of a surface emitting laser apparatus Z2 of the present embodiment that are the same as those of the surface emitting laser apparatus Z1 of the first embodiment are labeled by the same reference numerals, and the same components will not be reiterated herein.

In the surface emitting laser apparatus Z2 of the present embodiment, the current confinement structure 14 is disposed in the second reflector layer 13, but is not connected to the active light-emitting layer 12. It should be noted that, in the present embodiment, the current confinement structure 14 is adjacent to the active light-emitting layer 12 and away from the second electrode layer 16. In this way, the current injected into the active light-emitting layer 12 through the confinement hole 14H can be more concentrated, so that the surface emitting laser apparatus Z2 can have an improved lighting efficiency. The confinement structure 14 can be the structure shown in FIG. 2 or FIG. 3. In the present embodiment, the first conductive doped layer 141 of the current confinement structure 14 is configured to face the first reflector layer 11, and is connected to a lower part of the second reflector layer 13. In addition, the second conductive doped layer 142 of the current confinement structure 14 is connected to an upper part of the second reflector layer 13, and the P-N junction SB is still formed between the second conductive doped layer 142 and the second reflector layer 13.

When the bias voltage is applied to the surface emitting laser apparatus Z2, the second conductive doped layer 142 and the first conductive doped layer 141 of the current confinement structure 14 are applied with the reverse bias voltage less than the collapse voltage, so that the current confinement structure 14 is in the non-conductive state. Therefore, the current is allowed to only pass through the confinement hole 14H of the current confinement structure 14. Accordingly, as long as the current confinement structure 14 can confine the current and provide the electrostatic discharge protection for the surface emitting laser apparatus Z2, the position of the current confinement structure 14 in the second reflector layer 13 is not limited in the present disclosure.

Third Embodiment

Figure 5:
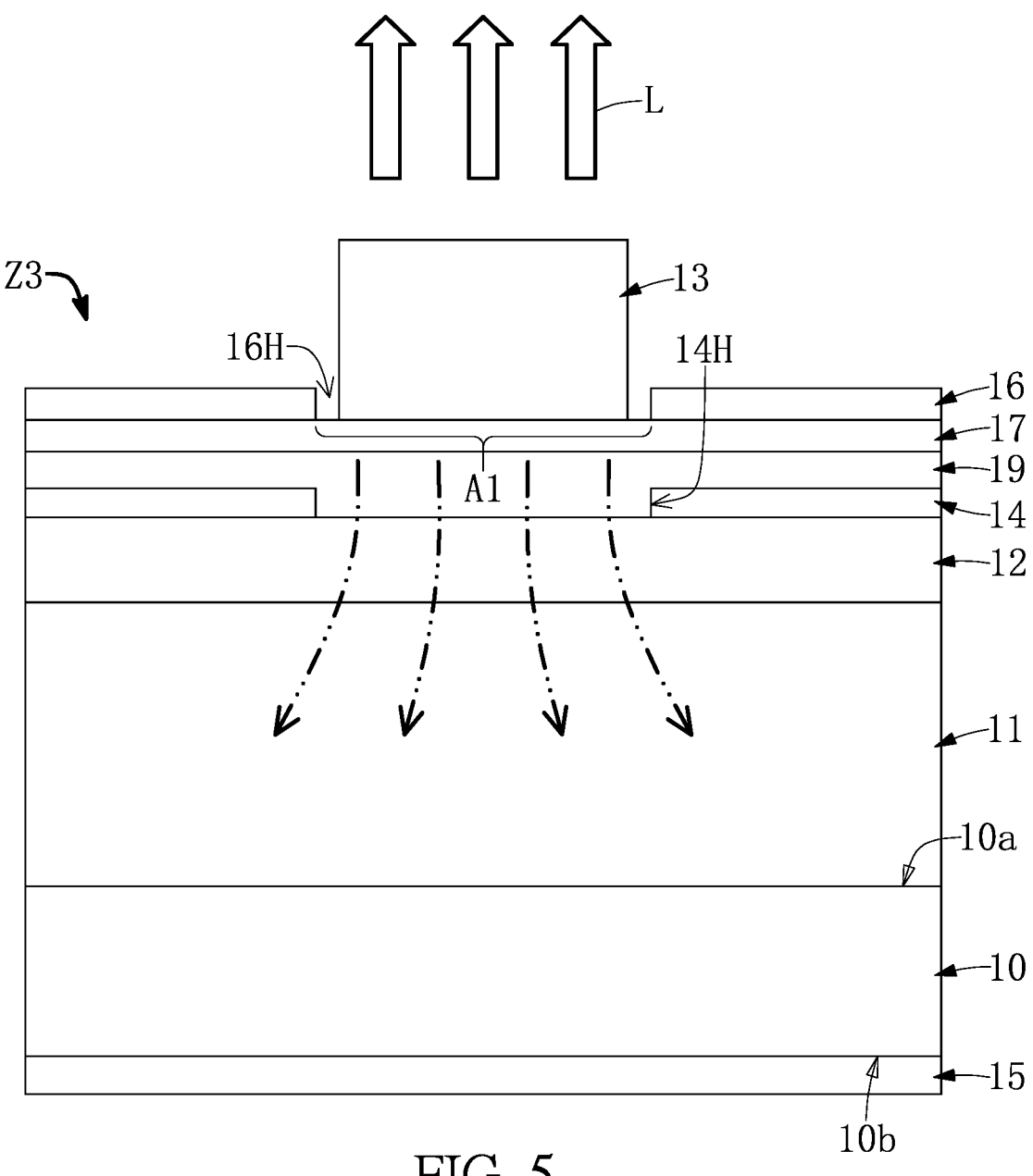
FIG. 5 is a schematic cross-sectional view of a surface emitting laser apparatus according to a third embodiment of the present disclosure.

Referring to FIG. 5, FIG. 5 is a schematic cross-sectional view of a surface emitting laser apparatus according to a third embodiment of the present disclosure. Components of a surface emitting laser apparatus Z3 of the present embodiment that are the same as those of the surface emitting laser apparatus Z1 of the first embodiment are labeled by the same reference numerals, and the same components will not be reiterated herein.

In the surface emitting laser apparatus Z3 of the present embodiment, the current confinement structure 14 is arranged between the active light-emitting layer 12 and the second reflector layer 13, but the current confinement structure 14 is not disposed in the second reflector layer 13. Specifically, the surface emitting laser apparatus Z3 of the present embodiment further includes a current injection layer 19, and the current injection layer 19 is arranged between the current confinement structure 14 and the second electrode layer 16. In the present embodiment, a part of the current injection layer 19 is filled into the confinement hole 14H of the current confinement structure 14.

Further, in the present embodiment, a material of the current injection layer 19 is a doped semiconductor material, and the current injection layer 19 and the second conductive doped layer 142 have different conductivity types. As such, another one of the P-N junctions (not labeled) is formed between the current injection layer 19 and the second conductive doped layer 142. In one embodiment, the semiconductor material of the current injection layer 19 can be the same as the semiconductor material of the first conductive doped layer 141, but the present disclosure is not limited thereto. In another embodiment, the current confinement structure can be not connected to the active light-emitting layer 12, but is embedded in the current injection layer 19.

The second electrode layer 16 can be electrically connected to the current injection layer 19 through the current spreading layer 17. Accordingly, when the bias voltage is applied to the surface emitting laser apparatus Z3, the second conductive doped layer 142 and the first conductive doped layer 141 of the current confinement structure 14 are applied with the reverse bias voltage less than the collapse voltage, so that the current confinement structure 14 is in the non-conductive state. Therefore, the current is allowed to only pass through the confinement hole 14H of the current confinement structure 14.

In addition, the second reflector layer 13 and the second electrode layer 16 are jointly disposed on the current spreading layer 17. Specifically, the second reflector layer 13 is arranged in the opening 16H defined by the second electrode layer 16. In other words, the second electrode layer 16 of the present embodiment surrounds the second reflector layer 13. It is worth mentioning that, in the present embodiment, the material of the second reflector layer 13 can include the semiconductor material, an insulation material, or a combination thereof. The semiconductor material can be an intrinsic semiconductor material or a doped semiconductor material, but the present disclosure is not limited thereto. For example, the semiconductor material can be silicon, indium gallium aluminum arsenide (InGaAlAs), indium gallium arsenide phosphide (InGaAsP), indium phosphide (InP), indium aluminum arsenide (InAlAs), aluminum gallium arsenide (AlGaAs), or aluminum gallium nitride (AlGaN), and is selected according to the wavelength of the laser beam L. The insulation material can be oxides or nitrides (such as silicon oxide, titanium oxide, and aluminum oxide), but the present disclosure is not limited thereto.

In one embodiment, the second reflector layer 13 can include multiple pairs of film layers, and a material of each pair of the film layers can be selected from the materials described above. For example, each pair of the film layers can be a titanium oxide layer and a silicon oxide layer, a silicon layer and an aluminum oxide layer, or the titanium oxide layer and the aluminum oxide layer, and is determined according to the wavelength of the laser beam L to be produced. However, the present disclosure is not limited thereto.

Fourth Embodiment

Figure 6:
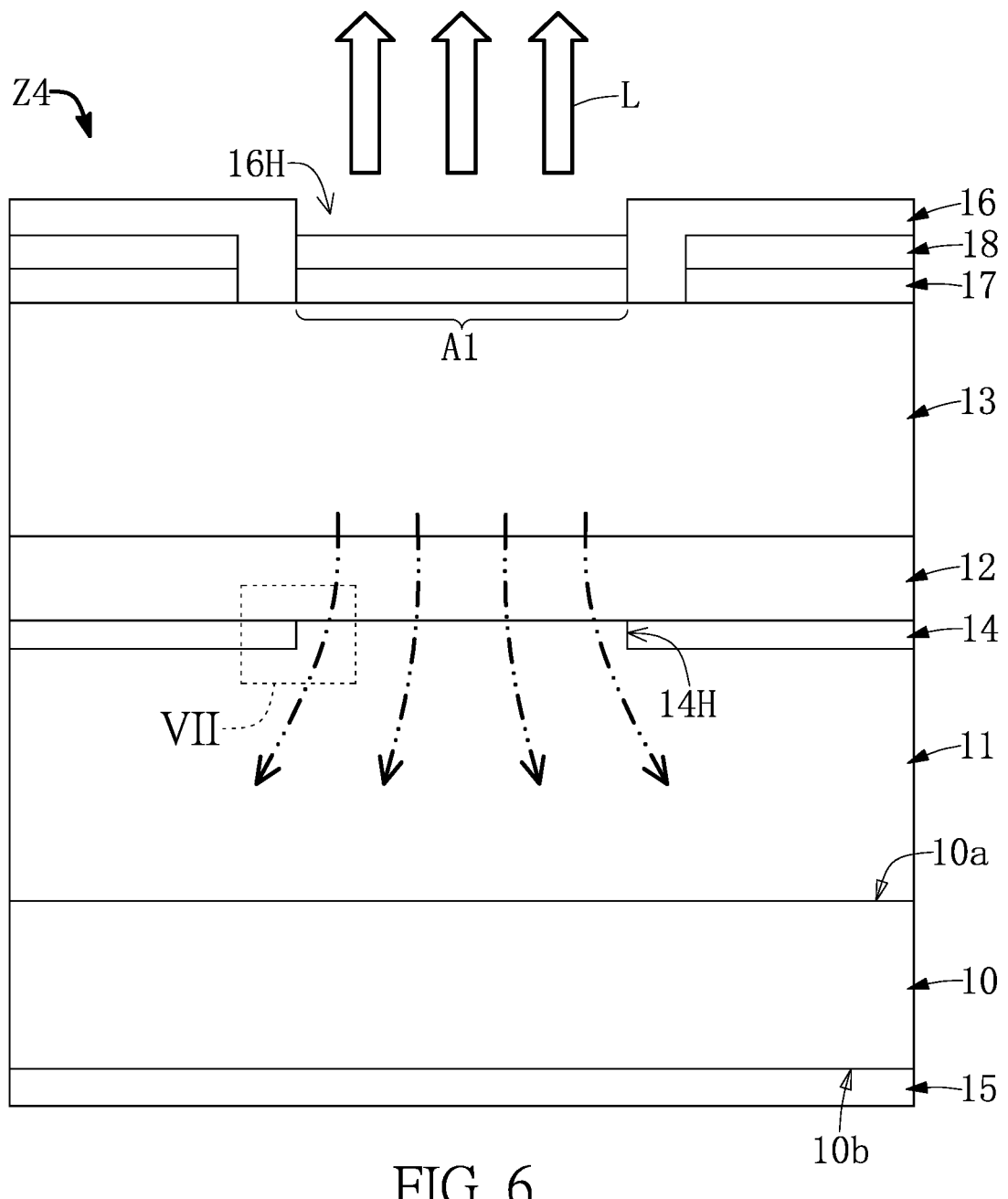
FIG. 6 is a schematic cross-sectional view of a surface emitting laser apparatus according to a fourth embodiment of the present disclosure.
Figure 7:
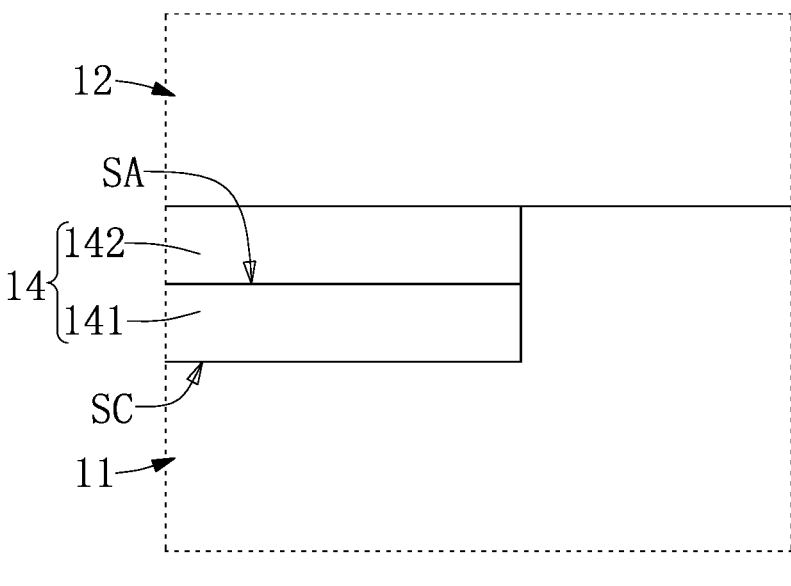
FIG. 7 is a schematic enlarged view of part VII of FIG. 6.

Referring to FIG. 6 and FIG. 7, FIG. 6 is a schematic cross-sectional view of a surface emitting laser apparatus according to a fourth embodiment of the present disclosure, and FIG. 7 is a schematic enlarged view of part VII of FIG. 6. Components of a surface emitting laser apparatus Z4 of the present embodiment that are the same or similar to those of the surface emitting laser apparatus Z1 of the first embodiment are labeled by the same reference numerals, and the same components will not be reiterated herein. In the present embodiment, the current confinement structure 14 is arranged between the active light-emitting layer 12 and the first reflector layer 11. Specifically, the current confinement structure 14 can be embedded in the first reflector layer 11 and connected to the active light-emitting layer 12.

As shown in FIG. 7, the current confinement structure 14 includes the first conductive doped layer 141 and the second conductive doped layer 142, and the P-N junction SA is formed between the first conductive doped layer 141 and the second conductive doped layer 142. In addition, the first conductive doped layer 141 is configured to face the first electrode layer 15, and the second conductive doped layer 142 is configured to face the second electrode layer 16. Accordingly, in the first reflector layer 11, the current confinement structure 14 of the present embodiment includes the Zener diode that is jointly formed by the first conductive doped layer 141 and the second conductive doped layer 142.

In the present embodiment, the second conductive doped layer 142 is arranged between the first conductive doped layer 141 and the active light-emitting layer 12. Since the first conductive doped layer 141 and the first reflector layer 11 have different conductivity types, another P-N junction SC is formed between the first conductive doped layer 141 and the first reflector layer 11. For example, when the conductivity type of the first reflector layer 11 is the N-type, the conductivity type of the first conductive doped layer 141 is the P-type, and the conductivity type of the second conductive doped layer 142 is the N-type. In addition, the second conductive doped layer 142 and the first reflector layer 11 can be made of the same or different materials, but the present disclosure is not limited thereto.

When the bias voltage is applied to the surface emitting laser apparatus Z4, the Zener diode of the current confinement structure 14 is applied with the reverse bias voltage less than the collapse voltage, so that the current confinement structure 14 is in the non-conductive state. Therefore, the current is allowed to only pass through the confinement hole 14H of the current confinement structure 14. When the electrostatic discharge is produced, the Zener diode of the current confinement structure 14 is conductive regardless of whether the electrostatic current is the positive current or the negative current. As such, most of the electrostatic current is allowed to pass through the current confinement structure 14, thereby providing the electrostatic discharge protection for the surface emitting laser apparatus Z4.

Figure 8:
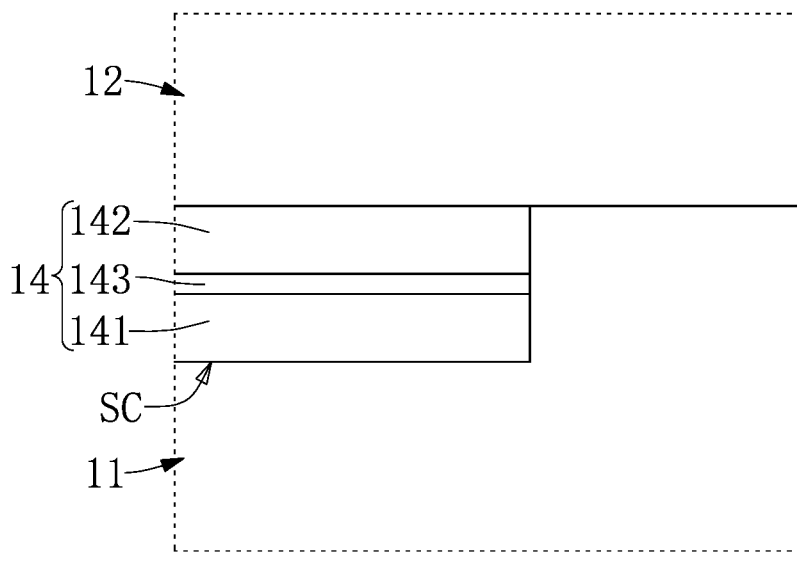
FIG. 8 is a partial schematic enlarged view of a surface emitting laser apparatus according to another embodiment of the present disclosure.

Referring to FIG. 8, FIG. 8 is a partial schematic enlarged view of a surface emitting laser apparatus according to another embodiment of the present disclosure. In the present embodiment, the current confinement structure 14 is disposed in the first reflector layer 11 and has the PIN junction, which can also achieve the same effect. Specifically, the current confinement structure 14 of the present embodiment can include the first conductive doped layer 141, the second conductive doped layer 142, and the intrinsic semiconductor layer 143. The intrinsic semiconductor layer 143 is arranged between the first conductive doped layer 141 and the second conductive doped layer 142. An operation principle of the current confinement structure 14 of the present embodiment is similar to that of the embodiment shown in FIG. 3, such that the electrostatic discharge protection can also be provided.

Fifth Embodiment

Figure 9:
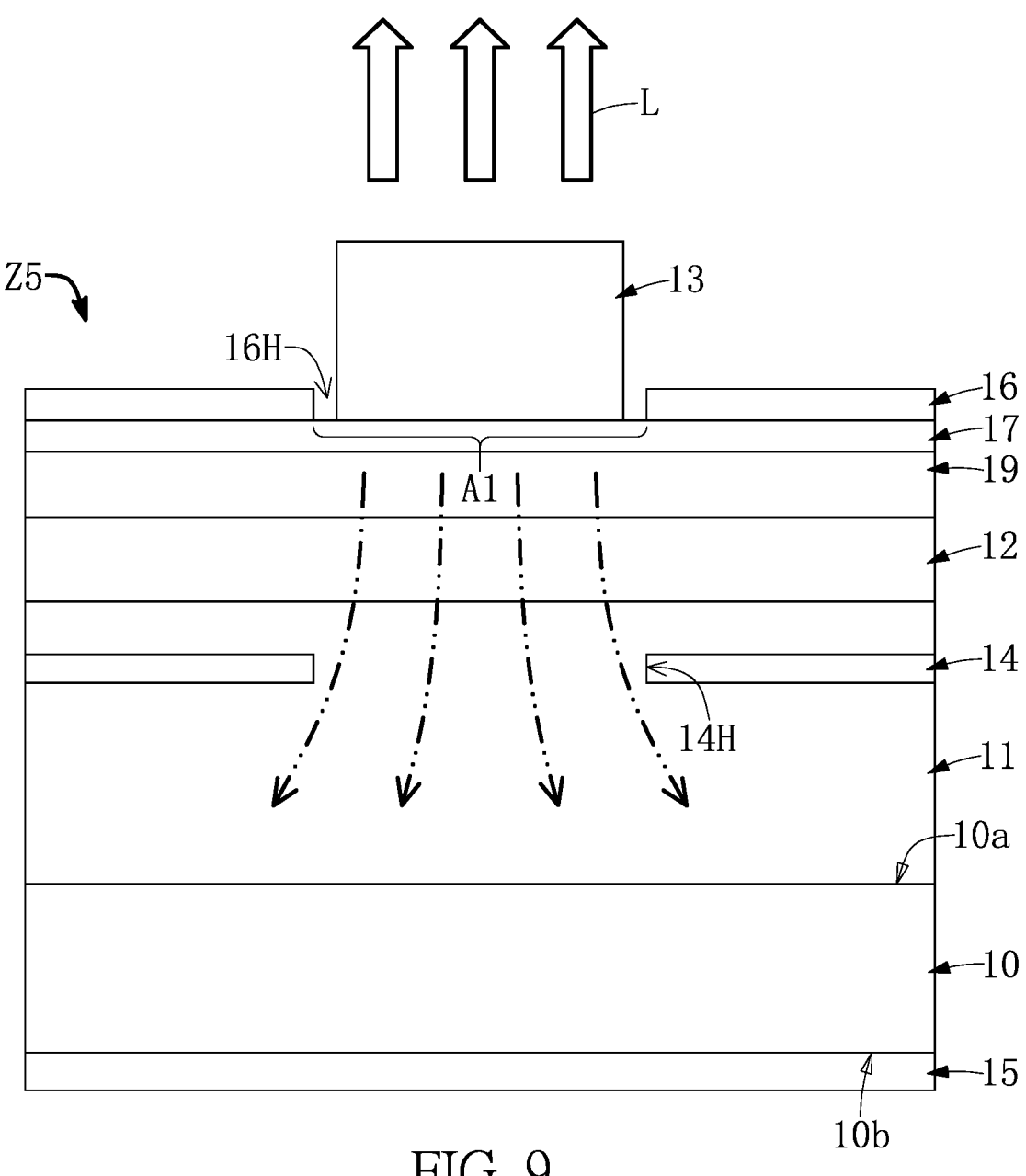
FIG. 9 is a schematic cross-sectional view of a surface emitting laser apparatus according to a fifth embodiment of the present disclosure.

Referring to FIG. 9, FIG. 9 is a schematic cross-sectional view of a surface emitting laser apparatus according to a fifth embodiment of the present disclosure. Components of a surface emitting laser apparatus Z5 of the present embodiment that are the same or similar to those of the surface emitting laser apparatus Z3 of the third embodiment are labeled by the same reference numerals, and the same components will not be reiterated herein. In the present embodiment, the current confinement structure 14 is embedded in the first reflector layer 11 but not connected to the active light-emitting layer 12. However, the current confinement structure 14 is adjacent to the active light-emitting layer 12 and away from the substrate 10. The current confinement structure 14 can be the structure shown in FIG. 7 or FIG. 8. Specifically, as long as the first conductive doped layer 141 and the first reflector layer 11 have different conductivity types to form the P-N junction, the current confinement structure 14 can be used to confine the current pathway, thereby providing the electrostatic discharge protection for the surface emitting laser apparatus Z5.

Figure 10:
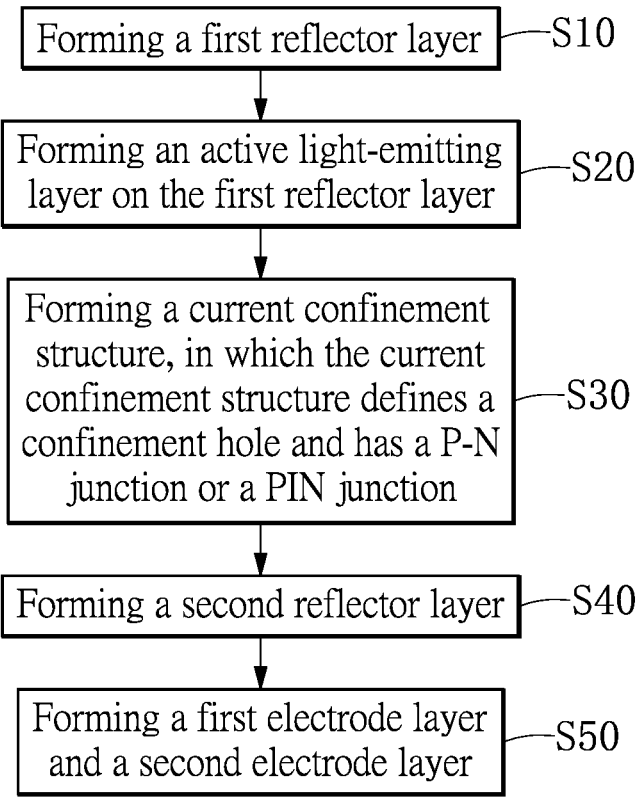
FIG. 10 is a flowchart of a method for manufacturing a surface emitting laser apparatus according to one embodiment of the present disclosure.

Referring to FIG. 10, FIG. 10 is a flowchart of a method of manufacturing a surface emitting laser apparatus according to one embodiment of the present disclosure. In step S10, a first reflector layer is formed. In step S20, an active light-emitting layer is formed on the first reflector layer. In step S30, a current confinement structure is formed on the active light-emitting layer. The current confinement structure defines a confinement hole and has a P-N junction or a PIN junction. In step S40, a second reflector layer is formed. In step S50, a first electrode layer and a second electrode layer are formed.

It is worth mentioning that the method provided in the present embodiment can be used to manufacture the surface emitting laser apparatus Z1 to Z5. Referring to FIG. 11 to FIG. 16, manufacturing of the surface emitting laser apparatus Z1 is taken as an example for illustrative purposes.

Figure 11:
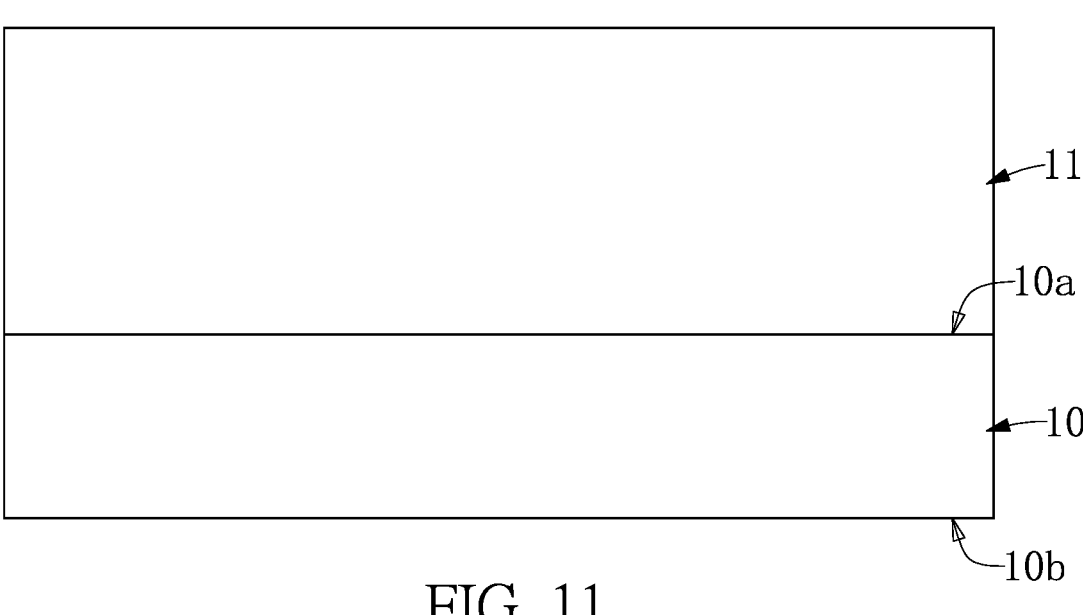
FIG. 11 is a schematic view of the surface emitting laser apparatus in step S10 of the method according to the embodiment of the present disclosure.

As shown in FIG. 11, the first reflector layer 11 is formed on the substrate 10. Specifically, the first reflector layer 11 is formed on the epitaxial surface 10a of the substrate 10. The material of the substrate 10 has been described above, and will not be reiterated herein. The substrate 10 and the first reflector layer 11 can have the same conductivity type.

Figure 12:
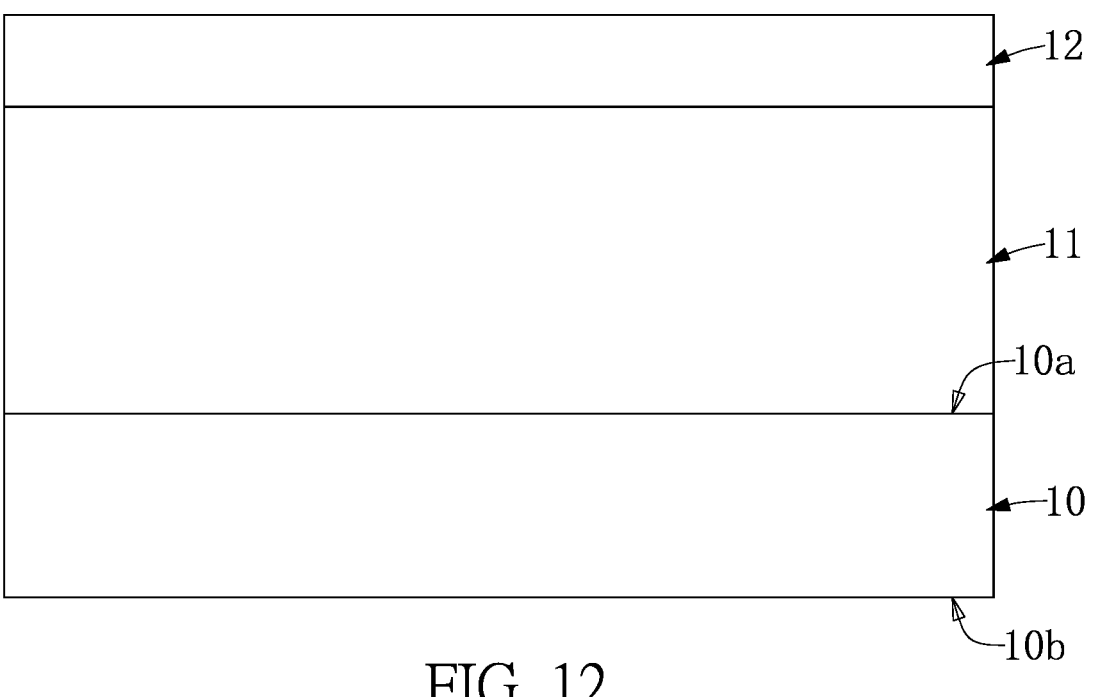
FIG. 12 is a schematic view of the surface emitting laser apparatus in step S20 of the method according to the embodiment of the present disclosure.

As shown in FIG. 12, the active light-emitting layer 12 is formed on the first reflector layer 11. The active light-emitting layer 12 can be formed by alternately forming the plurality of trap layers and the plurality of barrier layers on the first reflector layer 11. In one embodiment, the first reflector layer 11 and the active light-emitting layer 12 can be formed on the epitaxial surface 10a of the substrate 10 by a chemical vapor deposition process.

Figure 13:
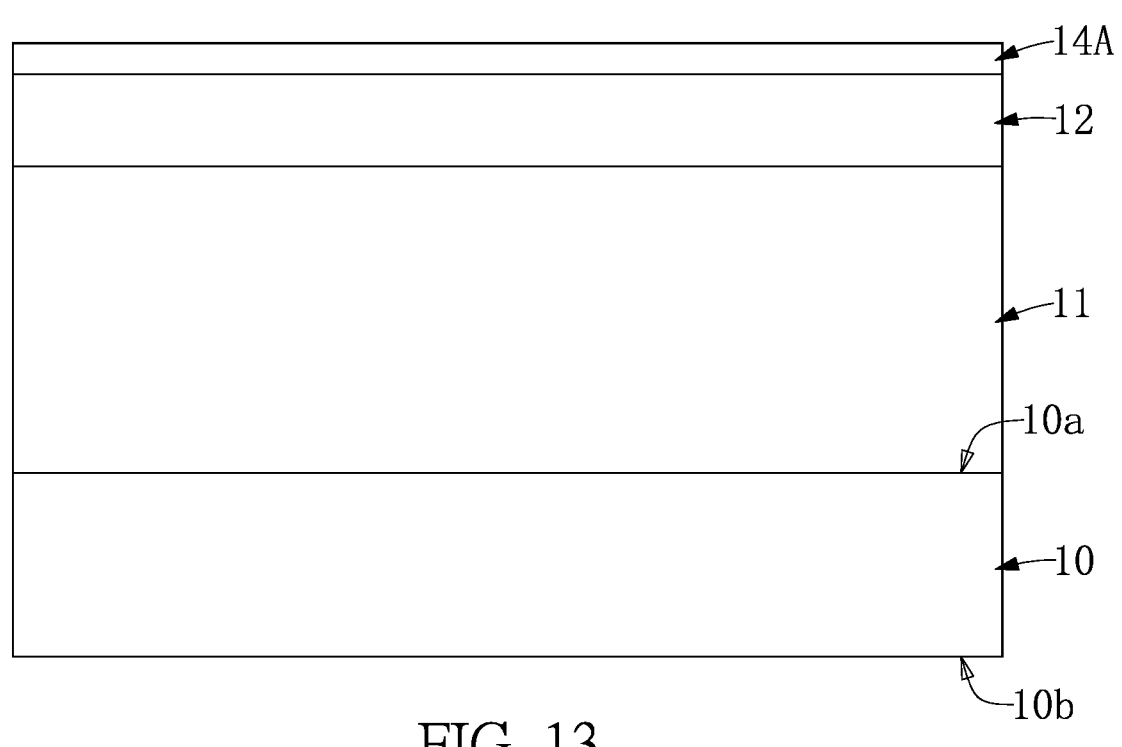
FIG. 13 and FIG. 14 are schematic views of the surface emitting laser apparatus in step S30 of the method according to the embodiment of the present disclosure.
Figure 14:
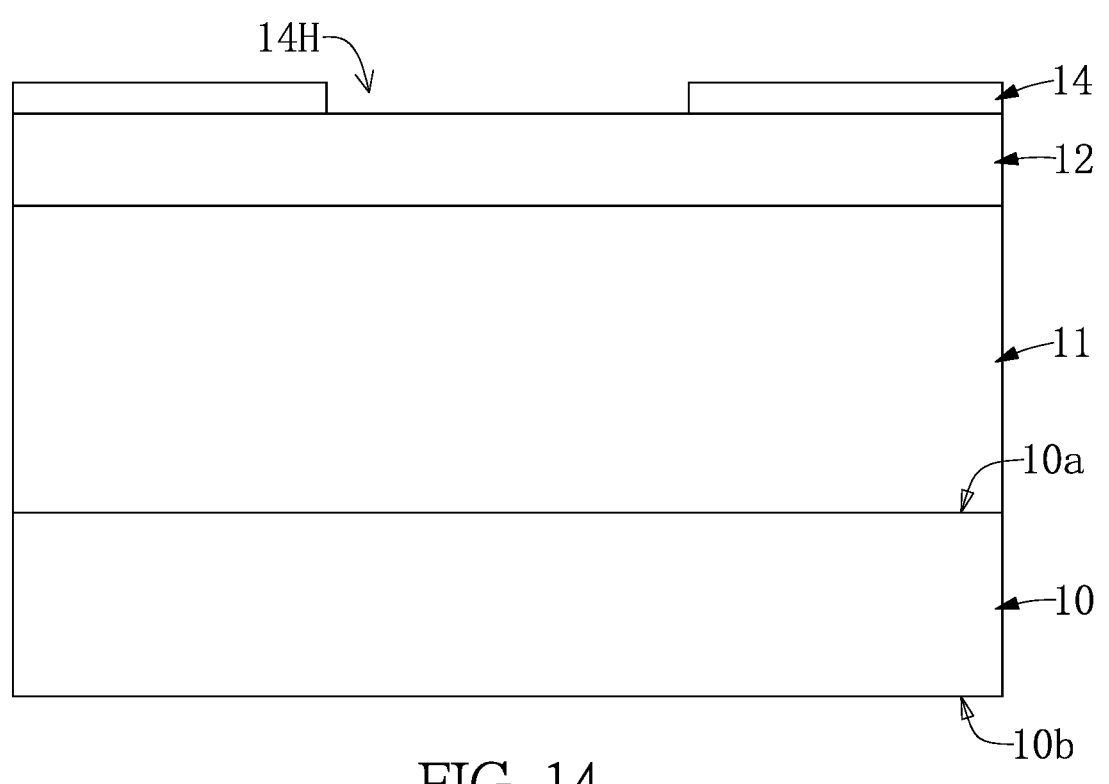

Referring to FIG. 13 and FIG. 14, a detailed process of forming the current confinement structure 14 on the active light-emitting layer 12 is shown. Further, reference is made to FIG. 2 and FIG. 13. In order to form the current confinement structure 14 shown in FIG. 2, the first conductive doped layer 141 and the second conductive doped layer 142 are sequentially formed on the active light-emitting layer 12. As shown in FIG. 13, the first conductive doped layer 141 and the second conductive doped layer 142 can jointly form a stacked structure 14A.

In order to form the current confinement structure 14 shown in FIG. 13, after the first conductive doped layer 141 is formed, the intrinsic semiconductor layer 143 is formed before the second conductive doped layer 142. In this case, the stacked structure 14A is jointly formed by the first conductive doped layer 141, the intrinsic semiconductor layer 143, and the second conductive doped layer 142.

Figure 15:
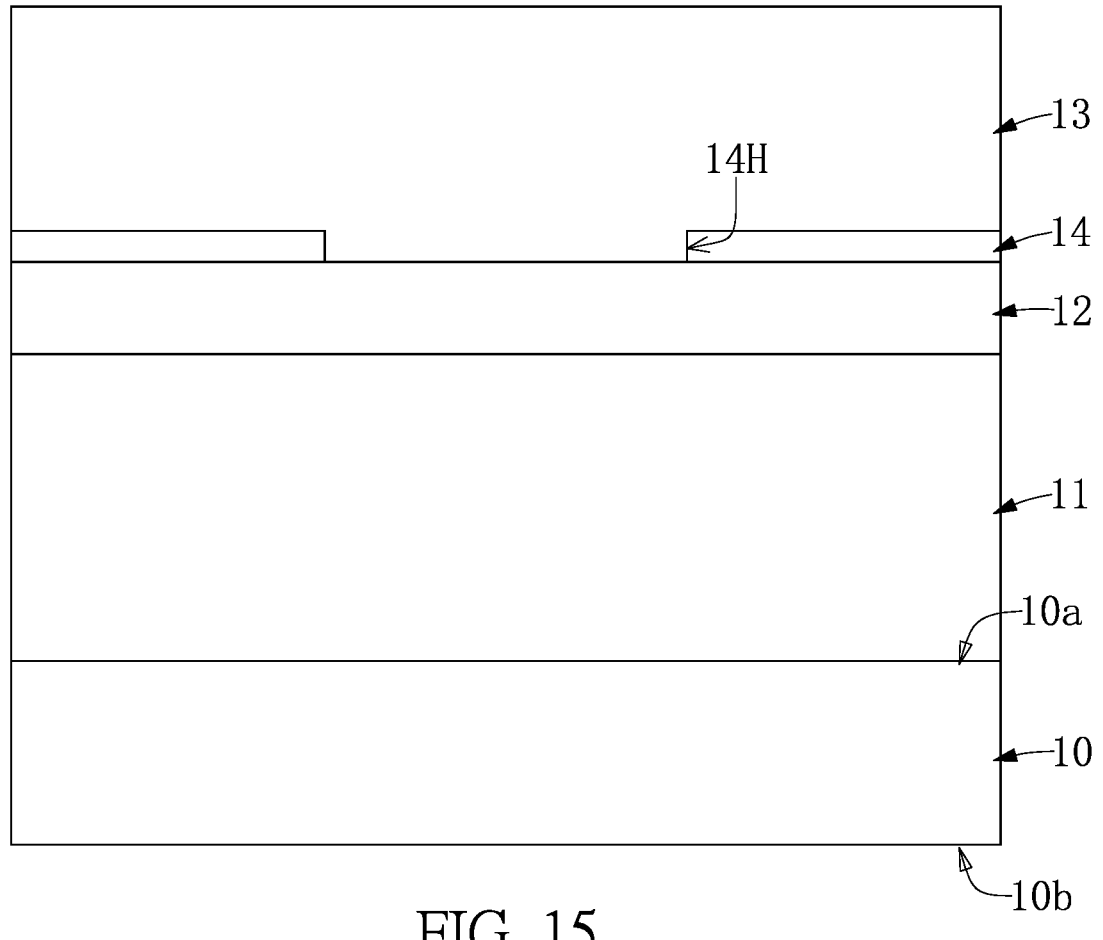
FIG. 15 is a schematic view of the surface emitting laser apparatus in step S40 of the method according to the embodiment of the present disclosure.

Referring to FIG. 14, in the present embodiment, the confinement hole 14H can be formed in the stacked structure 14A to expose a part of the active light-emitting layer 12. Further, the confinement hole 14H can be formed in the stacked structure 14A by an etching process. Referring to FIG. 15, the second reflector layer 13 is then formed on the current confinement structure 14 and the active light-emitting layer 12. Specifically, during formation of the second reflector layer 13, one part of the second reflection layer 13 is filled into the confinement hole 14H and connected to the active light-emitting layer 12.

Figure 16:
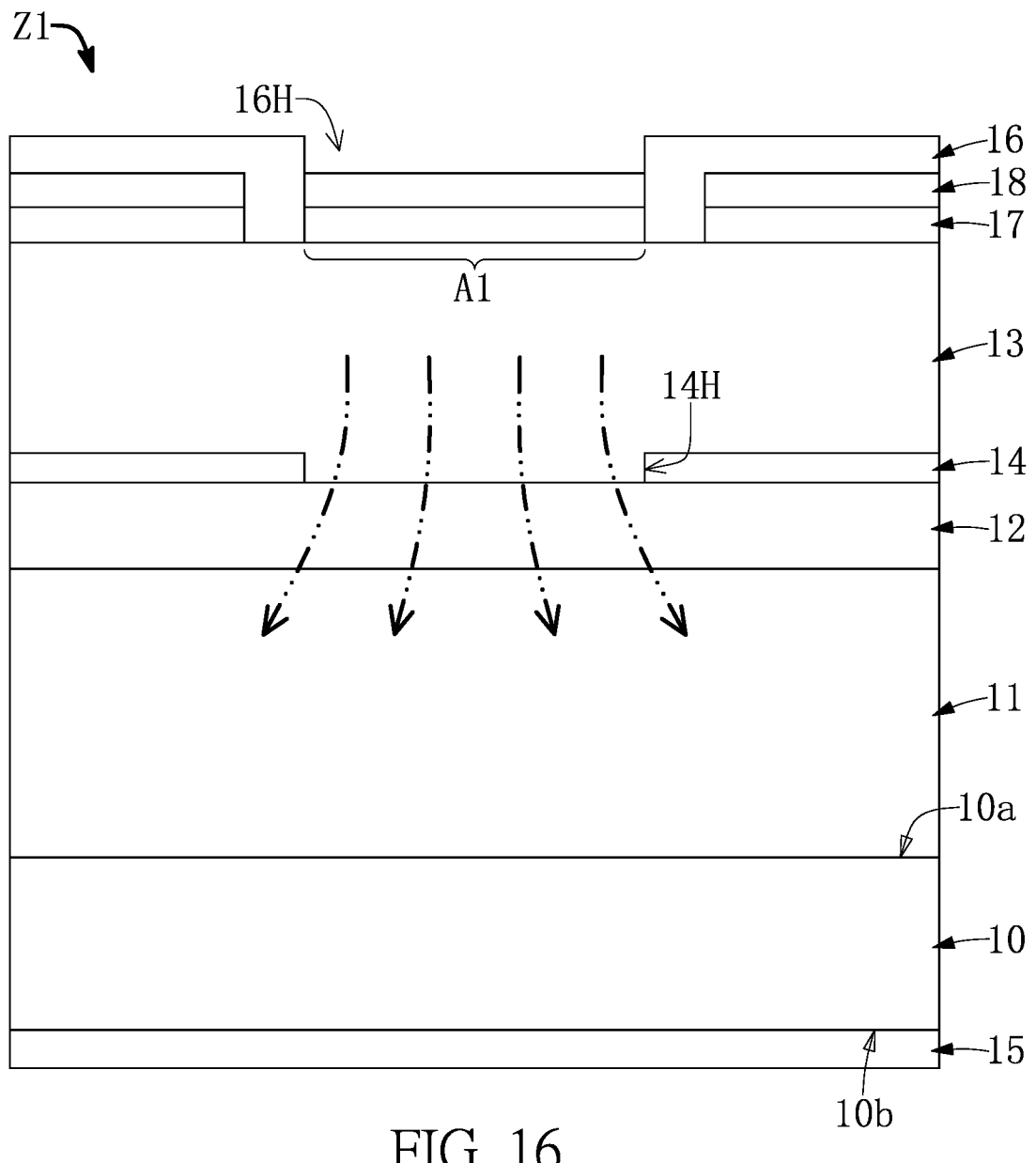
FIG. 16 is a schematic view of the surface emitting laser apparatus in step S50 of the method according to the embodiment of the present disclosure.

Referring to FIG. 16, the first electrode layer 15 is formed on the bottom surface 10b of the substrate 10, and the second electrode layer 16 is formed on the second reflector layer 13, so as to manufacture the surface emitting laser apparatus Z1 of the first embodiment of the present disclosure. In the present embodiment, the current spreading layer 17 and the protection layer 18 can be formed before formation of the second electrode layer 16.

It should be noted that, when the surface emitting laser apparatus Z2 of the second embodiment is being manufactured, one part of the second reflector layer 13 can be formed on the active light-emitting layer 12, and then the current confinement structure 14 with the confinement hole 14H is formed. Afterwards, another part of the second reflector layer 13 is regrown on the current confinement structure 14.

Figure 17:
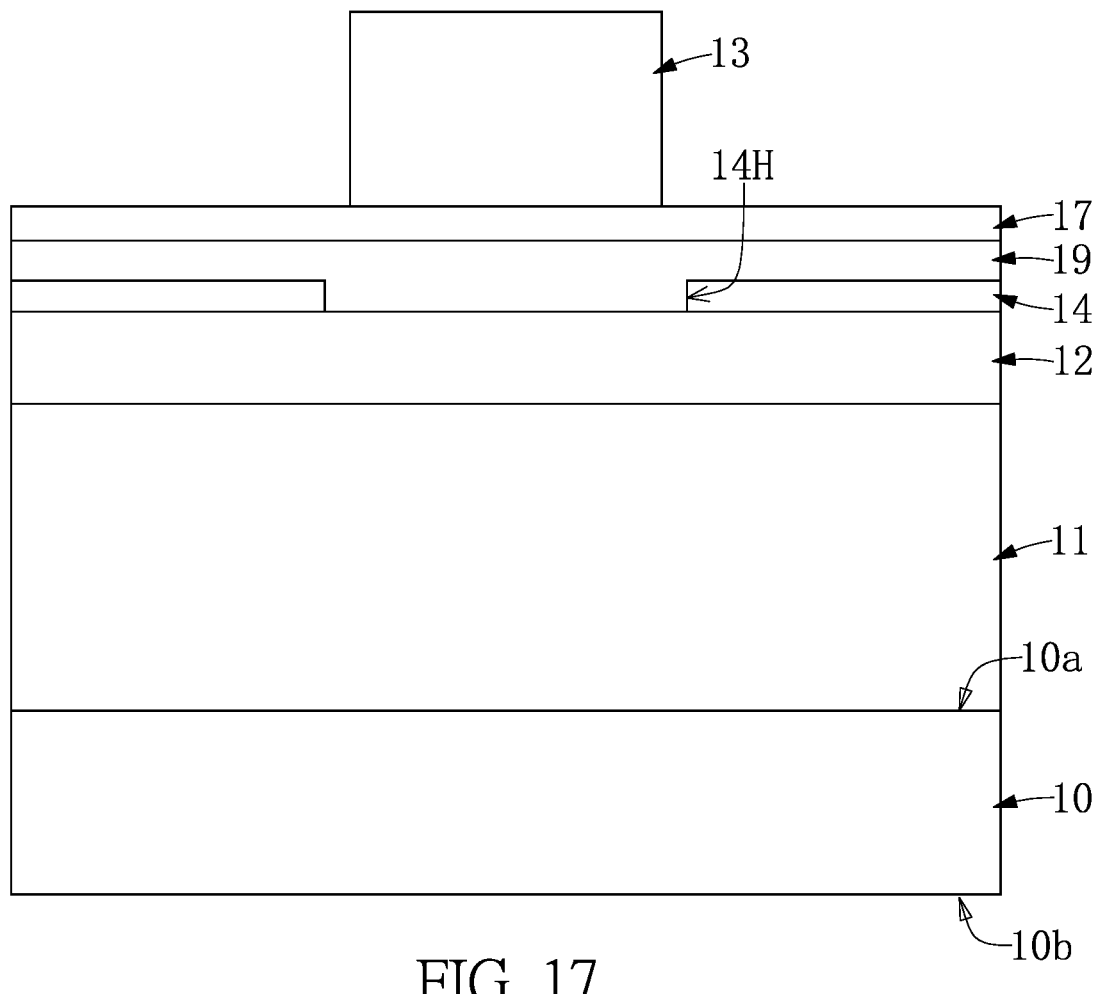
FIG. 17 is a schematic view of the surface emitting laser apparatus in step S40 of the method according to another embodiment of the present disclosure.

Reference is made to FIG. 17, which shows the step following the step of FIG. 14. The method of the embodiments of the present disclosure further includes: forming the current injection layer 19 on the current confinement structure 14. In the present embodiment, the step of forming the current injection layer 19 is performed before the step of forming the second reflector layer 13. As shown in FIG. 17, the current injection layer 19 is formed in the confinement hole 14H of the current confinement structure 14 and connected to the active light-emitting layer 12. Afterwards, the current spreading layer 17 and the second reflector layer 13 are formed on the current injection layer 19.

Figure 18:
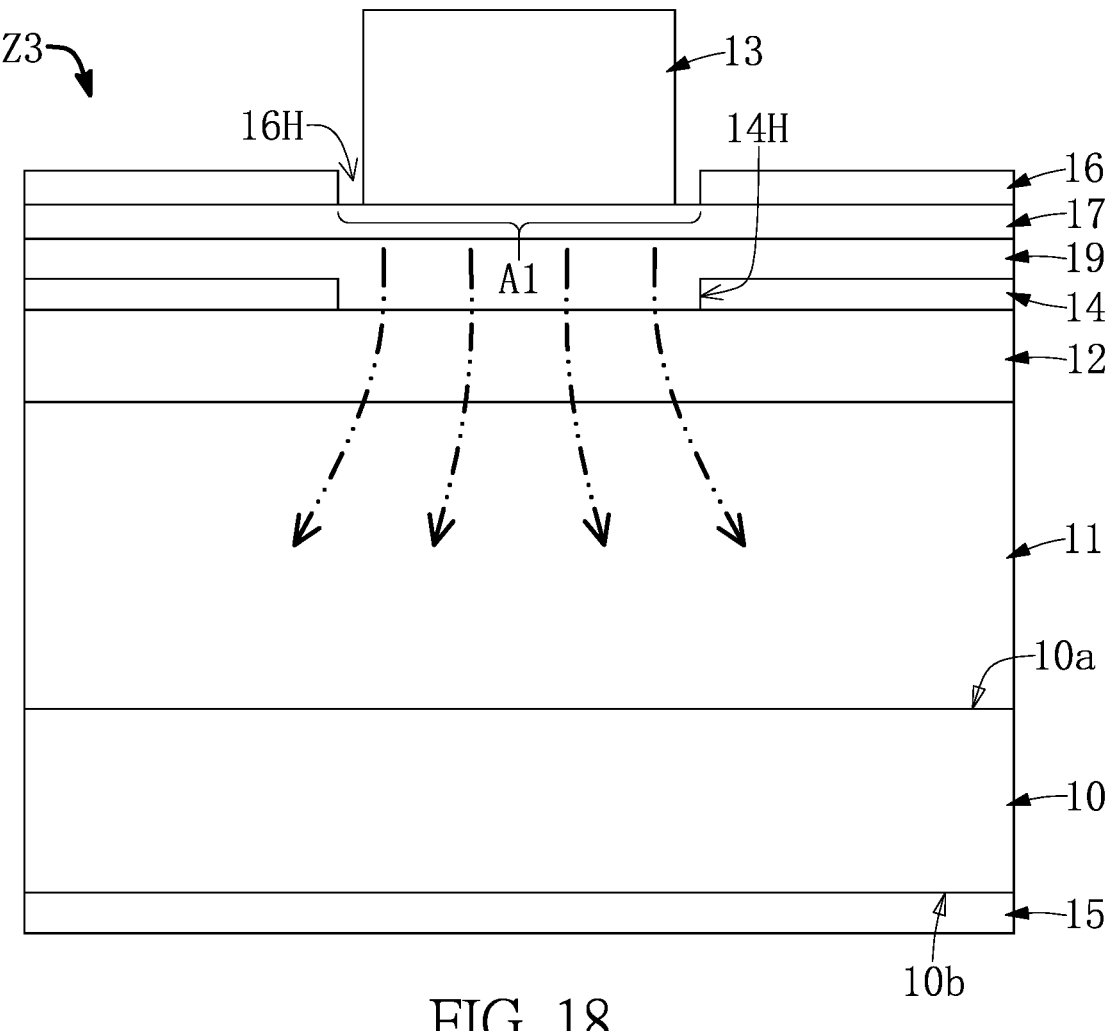
FIG. 18 is a schematic view of the surface emitting laser apparatus in step S50 of the method according to another embodiment of the present disclosure.

Referring to FIG. 18, the first electrode layer 15 is formed on the bottom surface 10b of the substrate 10, and the second electrode layer 16 is formed on the current spreading layer 17, so that the second electrode layer 16 is electrically connected to the current injection layer 19. In addition, the second electrode layer 16 has the opening 16H that corresponds to the confinement hole 14H, and the second electrode layer 16 surrounds the second reflector layer 13. In other words, the second reflector layer 13 is arranged in the opening 16H defined by the second electrode layer 16. In one embodiment, after the current spreading layer 17 is formed, the second reflector layer 13 is formed before the second electrode layer 16. In another embodiment, the step of forming the second reflector layer 13 and the step of forming the second electrode layer 16 can be switched. By performing the above steps, the surface emitting laser apparatus Z3 of the third embodiment can be manufactured.

It should be noted that, when the surface emitting laser apparatus Z4 of the fourth embodiment is being manufactured, the step S30 of forming the current confinement structure 14 can be performed before the step S20 of forming the active light-emitting layer 12. When the surface emitting laser apparatus Z5 of the fifth embodiment is being manufactured, a part of the first reflector layer 11 can be formed before the current confinement structure 14 with the confinement hole 14. Afterwards, another part of the first reflector layer 11 is regrown on the current confinement structure 14.

Beneficial Effects of the Embodiments

In conclusion, one of the beneficial effects of the present disclosure is that, in the surface emitting laser apparatus and the method for manufacturing the same provided by the present disclosure, by virtue of "the current confinement structure 14 having one P-N junction or one PIN junction" or "the current confinement structure 14 including a Zener diode," the surface emitting laser apparatus Z1 to Z5 can have an improved reliability.

Further, the current confinement structure 14 includes the first conductive doped layer 141 and the second conductive doped layer 142. The second conductive doped layer 142 and the second reflector layer 13 have different conductivity types, and the first conductive doped layer 141 of the current confinement structure 14 is configured to face the first reflector layer 11. When the bias voltage is applied to the surface emitting laser apparatus Z1 to Z5, the second conductive doped layer 142 and the first conductive doped layer 141 of the current confinement structure 14 are applied with the reverse bias voltage less than the collapse voltage, so that the current confinement structure 14 is in the non-conductive state. Therefore, the current is allowed to only pass through the confinement hole 14H of the current confinement structure 14.

When the electrostatic discharge is produced, the current confinement structure 14 is in the conductive state, so that most of the electrostatic current passes through the current confinement structure 14. Accordingly, the current confinement structure 14 of the embodiments of the present disclosure not only can be used to confine the current pathway, but can also provide the electrostatic discharge protection for the surface emitting laser apparatus Z1 to Z5.

Compared with a conventional surface emitting laser apparatus, in the surface emitting laser apparatus Z1 to Z5 of the embodiments of the present disclosure, the current confinement structure 14 can be used as an electrostatic protection structure without additional diodes disposed in parallel. In this way, costs can be reduced and a space for circuit layout in electronic products can be saved.

In addition, since each of the first reflector layer 11, the current confinement structure 14, the active light-emitting layer 12, and the second reflector layer 13 is made of the semiconductor material, their difference of thermal coefficient of expansion is small. In this way, the surface emitting laser apparatus Z1 to Z5 can be prevented from breaking (caused by the difference of thermal coefficient of expansion) after the annealing process, thereby improving the manufacturing yield. Since an oxide layer can be absent from the surface emitting laser apparatus Z1 to Z5 of the embodiments of the present disclosure, a step of performing a lateral oxidation process can be omitted during manufacturing of the surface emitting laser apparatus Z1 to Z5 of the embodiments of the present disclosure. In addition, it is not necessary to form a lateral groove in the surface emitting laser apparatus Z1 to Z5 of the embodiments of the present disclosure. Accordingly, the process of manufacturing the surface emitting laser apparatus Z1 to Z5 can be simplified, and manufacturing costs can be reduced. Moreover, entry of moisture into an interior of the surface emitting laser apparatus Z1 to Z5 during the later oxidation process (which may affect the light-emitting characteristics of the surface emitting laser apparatus Z1 to Z5) can be avoided. Therefore, the surface emitting laser apparatus Z1 to Z5 of the embodiments of the present disclosure can have a high reliability.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A surface emitting laser apparatus, comprising:
a first reflector layer;
an active light-emitting layer;
a second reflector layer, wherein the active light-emitting layer is disposed between the first reflector layer and the second reflector layer, so as to produce a laser beam; and
a current confinement structure having one PIN junction;
wherein the current confinement structure includes a first conductive doped layer, a second conductive doped layer, and an intrinsic semiconductor layer, and the intrinsic semiconductor layer is arranged between the first conductive doped layer and the second conductive doped layer to form the PIN junction;

wherein the second conductive doped layer and the second reflector layer have different conductivity types, and the first conductive doped layer of the current confinement structure is configured to face the first reflector layer; and wherein the current confinement structure is disposed in the second reflector layer and is in direct contact with the active light-emitting layer, the current confinement structure has a confinement hole, and a part of the second reflector layer is filled into the confinement hole and connected to the active light-emitting layer.

2. The surface emitting laser apparatus according to claim 1, wherein an energy gap width of a material of the current confinement structure is greater than an energy gap width of a semiconductor material of the active light-emitting layer.

3. The surface emitting laser apparatus according to claim 1, wherein a total thickness of the current confinement structure is at least 30 nm.

4. The surface emitting laser apparatus according to claim 1, further comprising:

a first electrode layer electrically connected to the first reflector layer; and a second electrode layer, wherein a current pathway passing through the active light-emitting layer is defined between the second electrode layer and the first electrode layer, the second electrode layer has an opening for defining a light-emitting region, and the opening corresponds to the confinement hole of the current confinement structure;

wherein at least a part of a Zener diode is arranged on the current pathway.

5. A surface emitting laser apparatus, comprising:

a first reflector layer;

a second reflector layer;

an active light-emitting layer, is disposed between the first reflector layer and the second reflector layer, so as to produce a laser beam; and a current confinement structure including a Zener diode;

wherein the current confinement structure is disposed in the second reflector layer and is in direct contact with the active light-emitting layer, the current confinement structure has a confinement hole, and a part of the second reflector layer is filled into the confinement hole and connected to the active light-emitting layer, and wherein the current confinement structure includes a first conductive doped layer and a second conductive doped layer, so as to form the Zener diode;

wherein the second conductive doped layer and the second reflector layer have different conductivity types, and the first conductive doped layer of the current confinement structure is configured to face the first reflector layer.

6. The surface emitting laser apparatus according to claim 5, further comprising:

a first electrode layer electrically connected to the first reflector layer; and a second electrode layer, wherein a current pathway passing through the active light-emitting layer is defined between the second electrode layer and the first electrode layer, the second electrode layer has an opening for defining a light-emitting region, and the opening corresponds to a confinement hole of the current confinement structure;

wherein at least a part of the Zener diode is arranged on the current pathway.

7. A method for manufacturing a surface emitting laser apparatus, comprising:

forming a first reflector layer;

forming an active light-emitting layer on the first reflector layer;

forming a current confinement structure, wherein the current confinement structure defines a confinement hole and has a PIN junction; and forming a second reflector layer;

wherein the step of forming the current confinement structure includes:

forming a first conductive doped layer, wherein the first conductive doped layer and the first reflector layer have different conductivity types;

forming a second conductive doped layer, wherein a stacked structure is jointly formed by the first conductive doped layer and the second conductive doped layer; and forming the confinement hole in the stacked structure;

wherein the current confinement structure is disposed in the second reflector layer and is in direct contact with the active light-emitting layer, and a part of the second reflector layer is filled into the confinement hole and connected to the active light-emitting layer.

* * * * *